United States Patent [19]
Foley et al.

[11] Patent Number: 5,156,938
[45] Date of Patent: Oct. 20, 1992

[54] ABLATION-TRANSFER IMAGING/RECORDING

[75] Inventors: Diane M. Foley, Northampton; Everett W. Bennett, Easthampton, both of Mass.; Sam C. Slifkin, deceased, late of S. Hadley, Mass., by Carolyn J. Slifkin, legal representative

[73] Assignee: Graphics Technology International, Inc., South Hadley, Mass.

[21] Appl. No.: 706,775

[22] Filed: May 29, 1991

Related U.S. Application Data

[63] Continuation-in-part of Ser. No. 497,648, Mar. 23, 1990, abandoned, which is a continuation-in-part of Ser. No. 330,497, Mar. 30, 1989, abandoned.

[51] Int. Cl.$^5$ .......................... G03C 8/02; G03C 8/44
[52] U.S. Cl. .................... 430/200; 346/76 L; 346/135.1; 346/1.1; 428/195; 430/199
[58] Field of Search ............... 430/201, 253, 964, 220, 430/270; 428/195; 346/76 L, 1.1

[56] References Cited

U.S. PATENT DOCUMENTS

| | | | |
|---|---|---|---|
| 3,787,210 | 1/1974 | Roberts | 430/964 |
| 3,964,389 | 6/1976 | Peterson | 430/201 |
| 4,529,684 | 7/1985 | Sasagawa et al. | 430/363 |
| 4,540,618 | 9/1985 | Suzuki et al. | 428/195 |
| 4,588,674 | 5/1986 | Stewart et al. | 346/76 L |
| 4,663,269 | 5/1987 | Narang et al. | 430/270 |
| 4,788,128 | 11/1988 | Barlow | 430/201 |
| 4,857,431 | 8/1989 | Kato et al. | 430/92 |
| 4,897,310 | 1/1990 | Beyer et al. | 428/195 |
| 4,973,572 | 11/1990 | DeBoer | 430/201 |

FOREIGN PATENT DOCUMENTS

61-206691 10/1986 Japan ........................ 430/945

*Primary Examiner*—Charles L. Bowers, Jr.
*Assistant Examiner*—Martin Angebranndt
*Attorney, Agent, or Firm*—Burns, Doane, Swecker & Mathis

[57] ABSTRACT

A unique method/system for simultaneously creating and transferring a contrasting pattern of intelligence on and from an ablation-transfer imaging medium to a receptor element in contiguous registration therewith is not dependent upon contrast imaging materials that must absorb the imaging radiation and is well adopted for such applications as, e.g., color proofing and printing, the security coding of various documents and the production of masks for the graphic arts and printed circuit industries; the ablation-transfer imaging medium, per se, comprises a support substrate and an imaging radiation-, preferably a laser radiation-ablative topcoat essentially coextensive therewith, such ablative topcoat having a non-imaging ablation sensitizer and an imaging amount of a non-ablation sensitizing contrast imaging material contained therein.

51 Claims, 2 Drawing Sheets

ABLATION-TRANSFER IMAGING/RECORDING

CROSS-REFERENCE TO RELATED APPLICATIONS

This application is a continuation-in-part of our co-pending application Ser. No. 07/497,648, filed Mar. 23, 1990, now abandoned and continuation-in-part thereof, Ser. No. 07/330,497, filed Mar. 30, 1989 and now abandoned. Other related applications are Ellis et al. co-pending application Ser. No. 07/592,790, filed Oct. 4, 1990 now abandoned and continuation-in-part thereof, Ser. No. 07/707,039, filed concurrently herewith, both assigned to the assignee hereof.

BACKGROUND OF THE INVENTION

1. Field of the Invention

The present invention relates to novel ablation-transfer imaging media comprising a support substrate having an image radiation-ablative topcoat essentially coextensive therewith, the imaging radiation-ablative topcoat including an ablation sensitizer and an imaging amount of a non-ablation sensitizing contract imaging material container therein. This invention also relates to a transfer method/system for simultaneously creating and transferring a contrasting pattern of intelligence on and from such ablation-transfer imaging media to a receptor element in contiguous registration therewith, whereby said imaging material delineates said pattern of intelligence thereon. The pattern of intelligence transferred to the receptor element is thus of opposite sign of that simultaneously created on the imaging medium.

The present invention especially relates to photo-induced ablation-transfer imaging/recording and, preferably, to laser-induced ablation-transfer imaging/recording particular adopted for such applications as color printing/proofing and masking.

2. Description of the Prior Art

The phenomenon of, e.g., laser-induced ablation-transfer imaging, is generically known to this art and is believed to entail both complex non-equilibrium physical and chemical mechanisms. Indeed, such laser-induced ablation-transfer is thought to be effected by the rapid and transient accumulation of pressure beneath and/or within a mass transfer layer initiated by imagewise irradiation. Transient pressure accumulation can be attributed to one or more of the following factors: rapid gas formation via chemical decomposition and/or rapid heating of trapped gases, evaporation, photo and thermal expansion, ionization and/or by propagation of a shockwave. The force produced by the release of such pressure is preferably sufficient to cause transfer of the imaging layer to an adjacent receptor element. The force is preferably sufficient to effect the complete transfer of the exposed area of an entire layer rather than the partial or selective transfer of components thereof.

Other material transfer imaging/recording techniques based on equilibrium physical changes in the material are also known to this art, but are limited in terms of both the overall speed of the process as well as in the materials which can be employed therefor. In particular, ablation transfer differs from known material transfer techniques such as, for example, thermal melt transfer and dye sublimation/dye diffusion thermal transfer (D2T2). Each of these prior art techniques typically employs thermal print heads as the source of imaging energy.

Alternatively, it is known to employ laser heating in lieu of the thermal printing head. In these systems, the donor sheet includes a material which strongly absorbs at the wavelength of the laser emission. In the thermal melt transfer process, when the donor sheet is irradiated, this absorbing material converts the laser light to thermal energy and transfers the heat to a colorant transfer layer which also includes a binder, fusible compound, etc., thereby raising its temperature above its melting point to effect its transfer onto an adjacent receptor sheet. In the D2T2 process, only the colorant is transferred to a specially treated or special receptor sheet (e.g., coated or porous) by sublimation or thermal diffusion. See, for example, JP 62/140,884, UK Patent Application GB 2,083,726 and U.S. Pat. Nos. 4,804,975, 4,804,977, 4,876,235, 4,753,923 and 4,912,083.

Compare also U.S. Pat. No. 3,745,586 relating to the use of laser energy to selectively irradiate the uncoated surface of a thin film element, coated on one side with a contrast imaging absorber, to vaporize and to cause the selective transfer of the absorber coating to an adjacently spaced receptor, and U.S. Pat. No. 3,978,247 relating to sublimation transfer recording via laser energy (laser addressed D2T2), wherein the contrast imaging material is also the absorber.

Nonetheless, these processes are limited in a variety of significant respects. For example, in melt transfer, the composition must contain low melting materials to transfer a pigment or dye and receptor sheets appropriately textured for wicking or having special coatings are required for best results. In D2T2, only the imaging dye itself is transferred; thus, it becomes necessary to employ special receptor sheets in order to effectively bind and stabilize ("trap") the dye. Compare, for example, U.S. Pat. No. 4,914,078 to Hann et al. Furthermore, additional post-heating treatment steps, such as the "setting" of the dyes in the binder which is present on the receptor sheet increases both the complexity and the time associated with the process. Such process is also limited to those dyes and pigments which undergo sublimation or diffusion in response to the particular imaging stimulus.

These processes are further limited in that the relatively slow processes of heat diffusion and thermal equilibrium are involved.

Accordingly, need exists in this art for a transfer process which is far more rapid that current transfer techniques, which can effectively employ a wide variety of contrast materials and which is not limited to specially treated or special receptor elements.

Laser-induced recording based on the removal or displacement of material from the exposed area is also known to the recording art. However, these applications do not require transfer of material from one substrate to another. Historically, laser-induced recording has been used, for example, in optical disk writing with near infrared (IR) lasers typically emitting at wavelengths ranging from 760 nm to 850 nm employed as the writing source. Since polymeric binders are typically non-absorbent in the near infrared region (760 nm to 2500 nm), infrared absorbers, i.e., sensitizers, are added to the binders to absorb the laser radiation. This arrangement allows the laser radiation absorbed by the sensitizer to be converted to heat which causes pit formation. See, for example, U.S. Pat. Nos. 4,415,621, 4,446,233, 4,582,776 and 4,809,022 and N. Shimadzu et al., *The Journal of Imaging Technology*, Vol. 15, No. 1, pg. 19 (1989). However, because this technology does not entail the imagewise transfer of materials from one substrate to another, these systems will not be further discussed.

These also exist in the recording art instances of laser-induced ablative transfer imaging entailing the displacement of material from a donor medium and adherently transferring same to an adjacent receptor element. These are limited to the use of large amounts of a black body absorber such as graphite or carbon black in conjunction with a Nd:YAG laser emitting at 1064 nm to transfer a black image. See, for example, U.S. Pat. Nos. 4,245,003, 4,702,958 and 4,711,834 (graphite sensitizer/absorber), U.S. Pat. No. 4,588,674 (carbon black sensitizer/absorber), and Great Britain Patent No. 2,176.018A (small amounts of Cyasorb IR 165,126 or 99 in combination with graphite as the sensitizer/absorber).

To produce these particular imaging media, the sensitizers/absorbers are usually dispersed in commercially available binders and coated onto a laser transparent support. The binders include both self-oxidizing binders, e.g., nitrocellulose, as well as non-self oxidizing binders such as, for example, ethylcellulose, acrylic resins, polymethylmethacrylate, polystyrene, phenolic resins, polyvinylidene chloride, vinyl chloride/vinyl acetate copolymers, cellulosic esters and the like. Since the black body absorbers employed are highly absorbent in the visible and ultraviolet (UV) as well as in the infrared region, the resulting transferred image is always black due to the presence of the absorber. Such ablative transfer imaging based on black body absorbers is therefore entirely ineffective and wholly unsuited for many applications, e.g., color transfer, imaging, color proofing, invisible security printing, etc.

Thus, serious need continues to exist in this art for a photo-induced ablative transfer imaging medium that can be sensitized independently of the contrast imaging material(s) and is therefore not limited to contrast materials which must absorb the imaging radiation. Like need exists for an ablative transfer imaging medium that may be sensitized to absorb visible and/or near IR light.

In particular, existing desiderata in this art include:
1. Media that can be employed in the photo-induced ablative transfer process to provide full color images faster than possible using current melt or sublimation techniques and that can be tailored to meet a wide variety of specifications for color imaging.
2. Media that can be employed in a photo-induced ablative transfer process to produce masks which selectively block the light from exposure units employed in pre-press production in the graphic arts and printed circuit industries.
3. Media that can be employed in a photo-induced ablative transfer process to produce substantially colorless fluorescent images, e.g., for the security marking of documents.

SUMMARY OF THE INVENTION

Accordingly, a major object of the present invention is the provision of novel technique for ablation-transfer imaging/recording that is not dependent upon contrast imaging materials that must absorb the imaging radiation and which novel technique otherwise avoids or conspicuously ameliorates the above disadvantages and drawbacks to data characterizing the state of this art.

Another object of this invention is the provision of novel technique for ablation-transfer imaging/recording that is not dependent upon contrast imaging materials that must absorb the imaging radiation and which is well adopted, in contradistinction to the known state of the ablative recording art, for such applications as multi-color/polychromal color proofing and color printing under a single set of imaging conditions.

Briefly, the present invention features a method for transferring a contrasting pattern of intelligence from an ablation-transfer imaging medium to a receptor element in contiguous registration therewith, said ablation-transfer imaging medium comprising a support substrate and an imaging radiation-ablative topcoat essentially coextensive therewith, especially a photo- and more preferably a laser ablative topcoat, said essentially coextensive topcoat comprising an effective ablative-transfer effecting amount of a non-imaging sensitizer that absorbs such imaging radiation, e.g. laser energy, at a rate sufficient to effect the imagewise ablation mass transfer of said topcoat, and said imaging radiative-ablative topcoat including an imaging amount of a non-ablation sensitizing contrast imaging material container therein. In particular, the present invention features a transfer method comprising imagewise irradiating said ablation-transfer imaging medium according to such pattern of intelligent at a rate sufficient to effect the ablation mass transfer of the imagewise-exposed area of the radiation-ablative topcoat of said imaging medium securedly onto said receptor element and whereby said imaging material delineates said pattern of intelligence thereon.

This invention also features such ablation-transfer imaging medium, per se, as well as an organization adopted for ablation-transfer imaging/recording including such ablation-transfer imaging medium and a receptor element in contiguous registration therewith, e.g., in face-to-face registered direct contact, or even spaced a slight distance therefrom which can extend up to 25 and in certain instances even up to 100 microns.

The present invention also features an assembly for ablation-transfer imaging/recording comprising the aforesaid organization and means for selectively irradiating, e.g., with laser energy or other sources of electromagnetic and even ultrasonic radiation, said ablation-transfer imaging medium to effect the ablation mass transfer of the selectively-irradiated area of the radiation-ablative topcoat of the imaging medium securedly onto the receptor element.

DETAILED DESCRIPTION OF THE PREFERRED EMBODIMENTS OF THE INVENTION

More particularly according to the present invention, it will be appreciated that the imaging radiation-ablative topcoat necessarily contains both a non-imaging ablation sensitizer that absorbs the imaging radiation as well as a non-ablation sensitizing contrast imaging material.

It will thus be seen that the ablation-transfer imaging media of this invention provide the distinct advantage of being sensitized independently of the contrast imaging material, a feature conspicuously alien to the prior art.

By "ablation sensitizer" is intended any initiator capable of initiating and promoting the ablation process. It does this by absorbing the imaging radiation and transferring the absorbed energy into an explosive ablative force. Such sensitizers/initiators are well known to the recording art. Light sensitization for imaging materials is of course also well known to the recording art. However, in marked contradistinction to the aforediscussed prior art laser-induced ablative transfer imaging (wherein a material is also displaced from a donor sheet and adherently transferred to a receptor element to record a pattern of intelligence thereon), the sensitizers of the present invention do not serve to distinguish or delineate the pattern of intelligence. Their intended function is not reading.

For example, in color imaging applications, the sensitizer(s) of the invention is (are) substantially colorless. For security printing application where UV light is used to cause fluorescence of an invisible pattern of intelligence, the sensitizer(s) of the invention does (do) not fluoresce in the visible region. And for masking applications, e.g., for fabricating printed circuits or graphic arts reproduction, the sensitizer(s) of the invention does (do) not function as the light blocking material.

Accordingly, such non-imaging ablation sensitizer is one that absorbs the radiation that causes ablation (write mode), but which is invisible or not substantially discernible to the detector used to distinguish the resulting pattern of contrasting intelligence (read mode). The sensitizer may be invisible or not discernible because it is nonabsorbing or nonemitting to the detector, or because its absorbance or emission is below the detection limit. Of course, the sensitizer must be capable of effecting the ablation of the topcoat under the intended imaging conditions when employed without the non-ablation sensitizing contrast imaging material.

By "non-ablation sensitizing contrast imaging material" is intended that material used to distinguish or delineate the resulting pattern of intelligence transferred to the receptor element.

Such contrast imaging material is, furthermore, incapable of initiating ablation-transfer without the above sensitizer/initiator under the intended imaging conditions that result in ablation. Failure of the contrast imaging material to itself initiate or promote ablation may be the result of a lack of absorbance at the ablation wavelength(s), a lack of sufficient absorbance of same, or a failure of absorbance to result in a pressure build up phenomenon, e.g., the absorbance provides a non-ablation promoting event such as photobleaching, stable triplet, fluorescence or phosphorescence. Thus, the contrast imaging material must be visible or discernible to the detector/technique used to distinguish the resulting pattern of intelligence transferred to the receptor element and/or remaining on the imaging medium, per se.

Exemplary such contrast imaging materials that can be ablatively transferred to a receptor element in a predetermined contrasting pattern of intelligence to visibly or symbolically represent or describe an object or data include the colorants (dyes or pigments), ultraviolet and infrared absorbing materials, polymeric materials, magnetic materials, fluorescent materials, conducting materials, etc.

In a preferred embodiment of the present invention, the subject ablation-transfer imaging/recording technique is advantageously photo-and more preferably laser-induced.

Photo- or laser-induced ablation-transfer comprehends a threshold energy below which no effective material transfer occurs and a requirement that the energy be input at a rate greater than the ability of the materials to reverse the factors leading to the aforenoted pressure accumulation, for example by excessive thermal diffusion outside the irradiated area. Thus, imaging radiation capable of exceeding the threshold energy (fluence, joules/cm$^2$) and power density (watts/cm$^2$) is required for effective image transfer. By proper selection of materials and imaging parameters, this latter requirement can lead to exposure times on a nanosecond time scale which is at least ten times faster than exposure times necessary for conventional transfer imaging processes. The actual values of fluence and power density suitable for photo- and laser-induced ablative transfer imaging are dependent on the specific materials employed in the imaging medium and the specific receptor selected.

In a preferred embodiment of the invention, the imaging radiation-ablative topcoat comprises at least one sensitizer which absorbs at the wavelength of the desired laser output in the near infrared spectral region of 760 nm to 3,000 nm, and at least one ablative binder. The at least one sensitizer is present in an amount sufficient to effect the rapid partial decomposition of the at least one binder when the at least one sensitizer interacts with laser light. The ablative binder advantageously comprises those polymeric materials which undergo rapid acid catalyzed partial decomposition, preferably at temperatures less than 200° C. as measured under equilibrium conditions. The topcoat may also, optionally, contain materials which are non-absorbing at the wavelength of the desired laser output and/or non-decomposing, as well as optimal amounts of commercially available binders which are not ablative binders in the imaging process. In another preferred embodiment, as more fully discussed below, the topcoat comprises at least one near infrared sensitizer, at least one ablative binder, and at least one hydrogen atom donating material (H·) for the acid catalyzed decomposition of the ablative binder (which may be present in the binder itself).

In another preferred embodiment of the present invention, a near infrared laser-ablation transfer imaging medium is provided. Such medium advantageously comprises a near infrared transparent support film bearing a layer of near infrared ablative coating employing a substantially colorless near infrared sensitizer. This medium can be effectively and advantageously em- ployed for color imaging when a (non-sensitizing) colorant is added.

Upon exposure to laser light, the absorbing sensitizer interacts with the laser light and causes rapid partial decomposition of the binder to gaseous and non-gaseous products. The rapid expansion of the heated gases causes ablation of the exposed topcoat onto an adjacent receptor sheet providing a reverse of the imaged color film (i.e., a color print or proof).

Suitable absorbing sensitizers according to the present invention include any material which can absorb at a desired wavelength for a particular near infrared or visible imaging wavelength and which preferably can initiate acid formation upon photo-excitation. In particular, where visibly transparent coatings are required, for example, substituted aromatic diamine dication diradical type sensitizers or cation radical sensitizers with counterions derived from strong acids and absorbing in the near IR are preferred. Exemplary such sensitizers include:

wherein R is alkyl, benzyl, substituted benzyl, etc.; X is $SbF_6^-$, $BF_4^-$, $PF_6^-$, $AsF_6^-$, $ClO_4^-$, $B(phenyl)_4^-$, triflate and other salts of strong acids which are not capable of electron donation to the cation radical or dictation radical in the ground state; A is one of the radicals of the formulae:

and B is one of the radicals of the formulae:

in which Y is hydrogen, alkyl, aryl, nitro, halo, benzyl, substituted benzyl, etc.

Examples of these sensitizers include the series of near infrared absorbers marketed under the trademarks Cyasorb IR 165, 126 and 99 by American Cyanamid, as well as those IR absorbers described in U.S. Pat. No. 4,656,121, hereby expressly incorporated by reference.

Radiation sources emitting near infrared wavelengths in combination with visibly colorless sensitizers are preferred for high fidelity color imaging applications. In other applications, any radiation source of sufficient intensity, typically not less than about $10^4$ watts/cm$^2$, emitting in the visible and/or near infrared can be employed for photo-ablation without limitation to black body sensitizers as essentially required by the prior art. The sensitizers of the present invention are most preferably highly absorbing at the wavelengths of the imaging radiation, soluble in the binders employed, and capable of initiating acid formation upon photo-excitation by the imaging radiation. Examples of suitable non-black body sensitizers which can be effectively employed in the ablative topcoat are cyanine dyes, phthalocyanine dyes, metal dithiolenes, methylene blue salts, di- and triarylmethane cation salts, Wurster's blue salts, and other visibly or near infrared absorbing onium salts derived from strong acids, etc. Various of these are described in U.S. Pat. Nos. 4,315,983, 4,508,811, 4,948,776, 4,948,777, 4,948,778 and 4,950,640, are also hereby expressly incorporated by reference.

Exemplary radiation emitting devices include solid state lamps, mercury arc lamps, and other lasers, xenon lamps, mercury arc lamps, and other visible and near infrared radiation source which are capable of providing sufficient energy to equal, or exceed, the threshold energy for ablation transfer and of providing this energy at such a rate as to institute that phenomenon of transient pressure accumulation discussed earlier and believed responsible for the ablative transfer process.

Since the value of threshold energy is intensity dependent, as well as materials dependent it is desirable to provide this energy as rapidly as possible. Other constituents on the exposure device include the ability to be focused to an image spot size and modulated at a dwell time suitable for the desired application.

Particularly representative devices for providing the imaging radiation includes lasers such as Nd:YAG lasers emitting at 1064 nm, for example that incorporated in the imaging hardware of the Crosfield Datrax 765 laser facsimile writer, laser diode systems emitting at 780-840 nm, or other radiation sources designated to provide a power density of $10^4$ watts/cm$^2$ or greater.

The radiation source is preferably focused to provide the most efficient utilization of energy when it is impinged upon the imaging medium.

The ablative binders according to the present invention are advantageously those polymeric materials which transfer under the imaging conditions, and are preferably those which undergo rapid acid catalyzed partial decomposition at temperatures of less than about 200° C. as measured under equilibrium conditions, and most preferably at temperatures of less than about 100° C. as measured under equilibrium conditions.

In particular, the preferred ablative binders according to this invention are those binders which decompose rapidly to produce effective amounts of gases and volatile fragments at temperatures of less than about 200° C. as measured under equilibrium conditions and the decomposition temperatures of which are significantly reduced in the presence of small amounts of generated acids. More preferably, the decomposition temperatures thereof are decreased to less than about 100° C.

Exemplary such polymers include nitrocellulose, polycarbonates and other polymers of the type described in J. M. J. Frechet, F. Bouchard, F. M. Houlihan, B. Kryczke and E. Eichler, *J. Imaging Science;* 30(2), pp. 59–64 (1986), and related polymers which are hereinafter more fully discussed.

Exemplary polycarbonate binders include those of the structure:

wherein B is one of the radicals of the formulae:

or other groups capable of generating a tertiary carbonium ion upon thermolysis and of producing gain or amplification in the decomposition of the polymer by eliminating a proton from the carbonium ion.

Stated differently, in addition to a thermal decomposition, as illustrated in the model system below:

the mechanism of the present invention preferably entails an acid catalyzed thermal decomposition:

as generally described by J. M. J. Frechet et al., *Journal of Imaging Science,* 30(2), 59(1986). Commercially available Bisphenol A polycarbonate decomposes at temperatures greater than 300° C. Non-tertiary diols and polyols may be polymerized in combination with tertiary diols to improve the physical properties of the polymer.

A may be the same as B or selected from among those dihydroxy aromatic or polyhydroxy compounds polymerizable into a polycarbonate.

The compounds:

are preferred.

The synthesis of these polymers has also been described, for example, by J. M. J. Frechet et al., *Polymer Journal*, 19(1), pp. 31-49 (1987).

In addition to the polycarbonates, polyurethanes having the following general structure can also be employed:

wherein b is as defined above and A is selected from among those aromatic or aliphatic diisocyanates or polyisocyanates copolymerizable with the above tertiary diols to produce a polyurethane.

The compounds:

are the preferred.

It is known that polyurethanes of primary and secondary diols and polyols decompose at temperatures greater than about 200° C. by the elimination mechanism:

wherein R is alkyl.

However, polyurethanes containing certain tertiary alcohol recurring structural units can decompose at temperatures less than about 200° C. by cleavage in a mechanism analogous to that of Frechet's polycarbonates, as illustrated below:

In addition to the immediately aforesaid polycarbonates, the polyurethanes that thermally decompose by acid catalysis are also preferred.

Small amounts (typically less than 10%) of non-tertiary diols and polyols may be polymerized in combination with the tertiary diols to improve the physical properties of such polymer without raising the energy requirements for ablation-transfer imaging. The synthesis of these polyurethanes is described in Example 1 below.

Other than the polycarbonates and polyurethanes, polyesters of the following general formulae derived from malonic or oxalic acid may also be employed:

and/or wherein B is as defined above. Polyorthoesters and polyacetals may also be used.

Typically, without raising the energy requirements for ablation-transfer imaging, small amounts (e.g., less than about 10%) of non-tertiary diols and polyols may be polymerized in combination with B to improve the physical properties of the polymer.

Small amounts (e.g., typically less than about 10%) of other compatible di- and polyacids may be polymerized in combination with the malonic or oxalic acid to improve the physical properties of the polymer without raising the energy requirements for ablation-transfer imaging.

Alternating block copolymers containing polycarbonate, polyurethane and/or polyester recurring structural units as described above, as well as those including polyorthoester and polyacetal recurring structural units, may also be used.

Other suitable ablative binder polymers include nitrocellulose, with a low viscosity SS (solvent soluble) nitrocellulose being particularly preferred from a coatability standpoint. Other examples of nitrocellulose which can be employed are described at pages 329-336 of *Cellulose and Its Derivatives* by Ister and Flegien which is incorporated herein by reference.

In addition, for proofing applications, the nitrocellulose is preferably added in the form of nitrocellulose containing printing inks which are compatible with the solvent used to dissolve the sensitizer. Examples of such compositions include solvent based gravure inks and process printing inks.

As indicated above, the binder employed ideally is soluble in the same solvent used for dissolving the near infrared absorbing sensitizer. However, dispersions may be used in appropriate circumstances when a mutual solvent cannot be determined.

The coating composition may also contain other materials which are non-absorbing at the desired laser emission wavelengths and/or non-decomposing and do not adversely affect the absorbance of the topcoat at the laser wavelength. These materials are selected depending upon the function of the final product to be produced. These materials may play a role in the imaging chemistry or may be inert.

In a preferred embodiment, substances believed capable of donating H· (hydrogen atom) to the excited state of the sensitizer are included in the coating composition, and may thereby increase acid formation. Such materials include alcohols, thiols, phenols, amines and hydrocarbons. Particularly preferred are low molecular weight secondary and tertiary alcohols, dios and polyols such as 1,2-decanediol, pinacol, 2,5-dimethylhexane-2,5-diol, 2,5-dimethyl-3-hexyne-2,5-diol and combinations of these. Addition of the hydrogen atom donors to the coating surprisingly enables the reduction of the amount of near IR absorber(s) from about 50% by weight based on solids content to about 5% to about 15% by weight based on solids content.

However, if, for example, nitrocellulose is employed as the polymeric binder, the use of an additional hydrogen atom donor material is not required because the desired hydrogen donors are already present within the resin.

Other additives which may be included are selected dependent on the final application of the imaged product. These additives are materials which can be ablatively-transferred to a receptor element in a predetermined contrasting pattern of intelligence to visibly or symbolically represent or describe an object or data, e.g., dyes and pigments, ultraviolet and infrared absorbing materials, polymeric materials, magnetic materials, conducting materials, fluorescent materials, etc.

Still other additives may be included to enhance the film properties and transfer characteristics. These additives need not function as a contrast imaging material and include, e.g., plasticizers, flow additives, slip agents, light stabilizers, anti-static agents, surfactants, brighteners, anti-oxidants and others known to the formulation art.

In one embodiment of the invention, in which the imaging media can be effectively employed in color transfer printing, the contrast additives are visibly absorbing dyes or pigments. The particular choice is dictated by the specifications for the final colored print. For example, in a color proofing application suited to newspaper printing, American Newspaper Publishers' Association (ANPA) specified Color Index (C.I.) Pigment Blue 15, C.I. Pigment Yellow 13 and C.I. Red 57 are used with a newsprint receptor. For color imaging which need not conform to any industry specifications, visibly absorbing dyes such as those available in the Morfast TM series (Morton International) can be used with any desired receptor, e.g., office copy paper. By "color proofing" is of course intended that technique, very well known to the recording art, of predicting or confirming one or more aspects of color printing prior to press, e.g., color rendition, tonal rendition, registration, composition, and the like.

In another embodiment, i.e., masking, in which the imaging media can be effectively employed as an exposure mask for use in graphic arts or printed circuit preproduction, the contrast additive comprises at least one material, other than the black body absorbers known to the prior art, which is effective in blocking the light output from common exposure devices. Exemplary such materials are curcumin, azo derivatives, oxadiazole derivatives, dicinnamalacetone derivatives, benzophenone derivatives, etc. By "masking" is intended that operation, also very well known to the recording art, including exposure of a typically light sensitive material, e.g., printing plate, resist, diazo, etc., through a pre-existing pattern of intelligence, e.g., a "mask", which selectively blocks the exposure radiation according to the pattern of intelligence, e.g., a printed circuit, newspaper page, etc.

In still another embodiment, in which the imaging media can be effectively employed in a security printing application, the contrast additives are substantially colorless materials which fluoresce in the visible spectral region when exposed to ultraviolet light. Representative such materials include oxazole derivatives, oxadiaxole derivatives, courmarin derivatives, carbostyryl derivatives, etc.

In yet another embodiment, the non-ablation sensitizing contrast imaging material is magnetic for the production of such machine readable items as information strips, checks, credit cards, etc. Exemplary thereof are iron, iron oxide, cobalt-iron oxide, barium ferrite, mixtures of the above, and the like.

The sensitizer and ablative binder are present in amounts sufficient to allow rapid partial decomposition of the binder to gaseous and non-gaseous products when the sensitizer interacts with imaging radiation, e.g., laser light. Preferably, the ablative binder is present in an amount of about 20% to about 95% by weight of dry solids while the sensitizer is present in an amount of about 5% to about 50% by weight of dry solids. In addition, the additives can be present in an amount of about 0.5% to about 50% by weight of dry solids while the hydrogen atom donor, including that provided by the polymer itself, can be present in an amount of about 1% to about 10% by weight of dry solids.

To prepare the coating composition for depositing the topcoating according to the present invention, a solution or dispersion is formulated which contains solvent, the near infrared absorbing sensitizer, the ablative binder and, optionally, the hydrogen atom donor and/or additives. Preferably, the components of the wet coating are present in amounts of about 0.2% to about 5% by weight of the absorbing sensitizer, about 0.5% to about 20% by weight of the ablative binder and, optionally, about 0.5% to about 2% by weight of a hydrogen atom donor and/or about 2% to about 20% by weight of the additives, with the remainder being solvent.

The dried coating is preferably less than three microns thick and most preferably less than one micron thick in order to minimize the amount of energy required for ablative transfer. Furthermore, the imaging medium advantageously has an absorption of at least 0.1 absorbance units at the wavelength(s) of the imaging radiation.

The solvent employed in the present invention includes those solvents which dissolve both the binders and preferably the near IR sensitizers. Exemplary such solvents include water, chlorinated hydrocarbons, such as methylene chloride, 1,1,1-trichloroethane, chloroform, carbon tetrachloride, trichloromethane and the like; ketones such as acetone, methyl ethyl ketone, methyl propyl ketone and higher boiling analogs whose analogs whose boiling points do not exceed the thermal decomposition thresholds of the binder resin, or mixtures thereof.

After the solution or dispersion is formulated, it is coated onto the support substrate by methods which are well-known to this art such as Meyer rod coating, gravure coating, reverse roll coating, modified bead coating or extrusion coating.

The support substrates employed can be either support films transparent to the imaging radiation or nontransparent such support films. Transparent support films which can be employed include glass, polyesters (by reason of their high optical clarity and dimensional stability), polycarbonates, polyurethanes, polyolefins, polyamides, polysulfones, polystyrenes, cellulosics and any support substrate which does not dissolve in the coating solvents employed, with polyesters being preferred. Examples of non-transparent supports include any non-transparent support substrate which would not dissolve in the coating solvents employed. These supports can include filled and/or coated opaque polyesters, aluminum supports, such as used in printing plates, and silicon chips. The thickness of such support substrates is not critical and can vary widely, same depending, for example, upon the particular intended application and whether irradiated from the front or back surface thereof.

As anti-reflection layer (vis-a-vis the imaging radiation) may optionally be provided on the face surface of the support opposite the ablative topcoat and/or on the receptor element, to enhance the efficiency of the ablative transfer by enabling more of the imaging radiation to be effectively utilized.

Such anti-reflection layer advantageously comprises one or more materials which are recognized for this purpose in the recording art, for example those described in U.S. Pat. Nos. 3,793,022 and 4,769,306, and are also applied in known manner. Suitable materials, e.g., for a polyester support substrate having a refractive index of about 1.6 are coatable materials having refractive indices of about 1.3 to 1.4. Exemplary such materials include Fluorad TM FC-721 from 3M Co., $CaF_2$, $MgF_2$, fluoropolymer, etc. The thickness of the anti-reflection layer(s) is selected as to provide the desired refractive properties for the layer(s) with respect to the wavelengths of the imaging radiation. For example, where Fluorad TM FC-721 is employed as the anti-reflection layer and 1064 nm imaging radiation is used, a thickness of about 0.2 to 0.25 microns is effective.

When the sensitizer is selected such as to be substantially colorless in the visible spectral region (400–760 nm), the laser imaging materials of the present invention can be advantageously employed in a color imaging and proofing method. By this method, a receptor sheet is positioned and firmly maintained, e.g., in a vacuum frame, relative to the above described laser imaging material in such manner that it is effective in receiving materials which have been ablated from the imaging medium.

Figure 1:
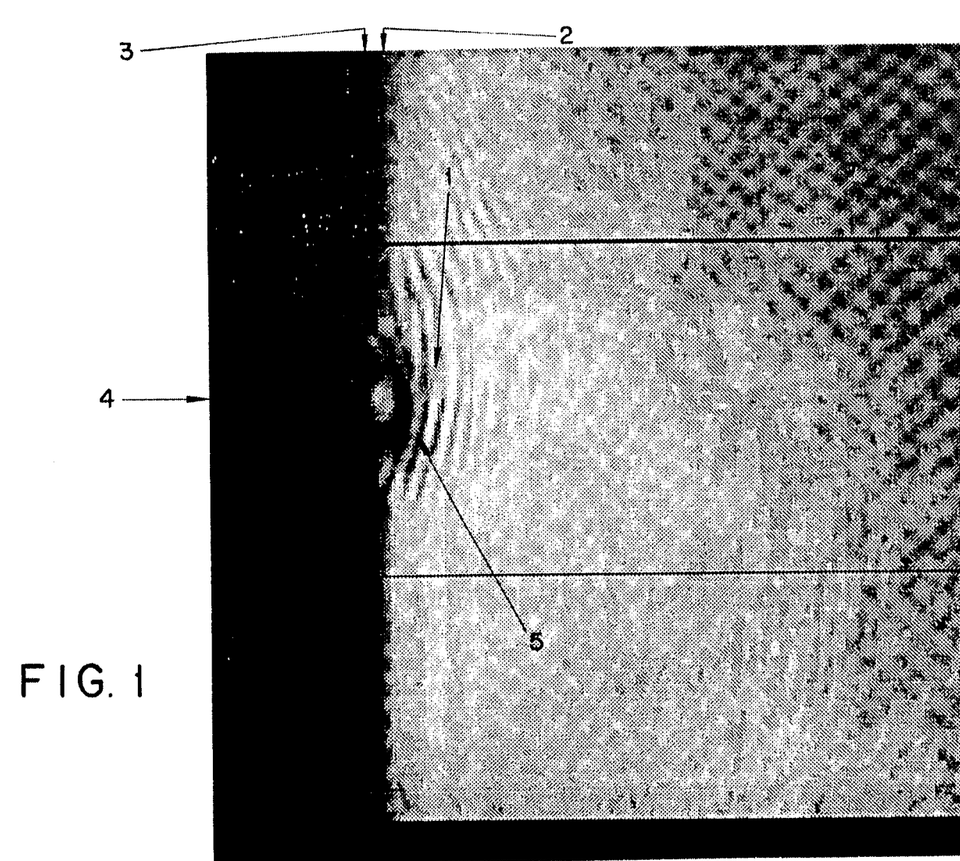
FIG. 1 is a side view photomicrograph of an imaging medium according to the present invention and the illuminated space above same, 100 nanoseconds after initiation of a 260 nanosecond laser pulse directed through the support substrate of said imaging medium and into the ablative topcoat thereof (the photomicrograph shows both the laser exposed and unexposed areas of the image medium)

The material transfer phenomenon of the laser-induced ablation process is illustrated by the photomicrograph obtained by the time resolved grazing incident microscopy, TRGIM, in FIG. 1.

FIG. 1 is a side view photomicrograph of an imaging medium according to the invention and the illuminated space thereabove (in lieu of a receptor element), taken 100 nanoseconds after the initiation of a 260 nanosecond pulse from a Nd:YAG laser, 4, directed through the polyester support, 3, about ¼" from the edge thereof and into the absorbing ablative topcoat, 2 (the imaging medium, per se, is more fully described in the Example 6 which follows), to produce a plume, 5, of ablated materials. The horizontal lines, 1, in the space above the medium are interference lines resulting from the use of coherent probe illumination. The Nd:YAG laser (1064 nm output from a Quantronics 116FL-0 laser controlled by an Anderson Laboratories' DLM-40-IR2.7 acousto-optic modulator and a 40 MHz signal processor) delivered 0.6 $J/cm^2$ in a 25 micron diameter beam ($1/e^2$). In FIG. 1, both the laser exposed and unexposed areas of the imaging medium are shown.

Figure 2:
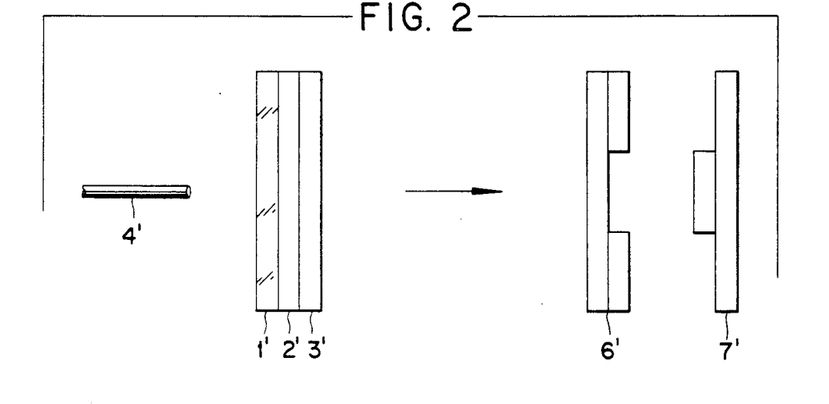
FIG. 2 is a schematic/diagrammatic illustration of the method/system according to the present invention, including one embodiment of the imaging medium wherein the support substrate thereof is transparent to the imaging radiation.

FIG. 2 illustrates the use of an imaging radiation transparent support substrate in the method of the present invention. In this embodiment, imaging radiation 4' impinges upon the imaging material which comprises an imaging radiation transparent support substrate, 1', the ablative topcoat, 2', and a receptor element, 3', from the back or support side of said imaging medium.

Figure 3:
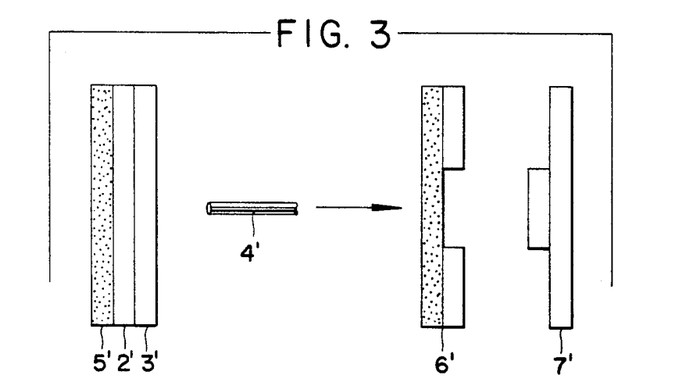
FIG. 3 is a schematic/diagrammatic illustration of another method/system of this invention, including a second embodiment of the imaging medium wherein the support substrate thereof is not transparent to the imaging radiation.

FIG. 3 illustrates an alternative embodiment of the present invention wherein the imaging material comprises a nontransparent support substrate 5'. In this embodiment, the receptor element, 3', is made of imaging radiation transparent material and the imaging radiation impinges upon the imaging material from the front or receiver sheet side of the material.

In either embodiment, a pattern of imaging radiation at the desired wavelength(s) is directed into the absorbing layer to effect rapid partial decomposition of the binder(s) to gaseous products, etc., that gives rise to that phenomenon of temporary pressure accumulation discussed earlier. This causes ablation of the topcoat and its transfer to the receptor element, thus producing an imaged donor film, 6', and a corresponding image of opposite sign on the receptor element, 7'.

The receptor element need not be specially treated or selected to effectively receive materials from the donor medium and can include, for example, those which are well-known in the art of proofing and printing, such as newsprint, coated or uncoated papers of all shades and color, opaque filled and opaque coated plastic sheets, with the printing stock to be employed in the particular color proofing application being preferred. Other suitable receptors include fabrics, wood, cardboard, glass, ceramics, leather, metals such as aluminum and copper, rubber, papers and plastics generally, etc. While the receptor element need not be specially treated or selected to assist in the ablation-transfer process, as indicated above, it is nonetheless also within the scope of this invention to employ a treated or coated receptor, for example a receptor sheet coated with an effective amount of an adhesive or sizing, to aid in the adhesion of the ablated topcoat thereto.

The imaging medium is most advantageously positioned and firmly maintained in face-to-face registered direct contact with the particular receptor element selected, to facilely transfer ablated topcoat thereto, by any means suitable for such purpose, e.g., positive pressure, a vacuum, or even by the adhesive properties of the receptor element itself.

In order to further illustrate the present invention and the advantages associated therewith, the following specific examples are given, it being understood that same are intended only as illustrative and in nowise limitative.

EXAMPLE 1

Polyurethane Synthesis (Polymer VII from Table 1)

2,4-Toluene diisocyanate (TDI), 20 g, 2,5-dimethyl-3-hexyne-2,5-diol, 16.3 g, dibutylin dilaurate, 0.25 ml, and N-methyl pyrrolidone, 50 ml, were added to a 200 ml flask equipped with a magnetic stirring bar and a nitrogen inlet. The solution was stirred 6 hours at 50° C., then at room temperature overnight. The polymer was isolated by precipitation from water. It had a molecular weight of approximately 7,000 (GPC) and a thermal decomposition temperature of 165° C. (broad) as determined by Differential Scanning Calorimetry (DSC) at a scan rate of 25° C./min.

The polyurethanes indicated by the Roman numerals V to XIII in Table 1 were synthesized from the corresponding monomers depicted in the first horizontal and vertical columns by the immediately above procedure. The polycarbonates III and IV in Table 1 were synthesized from the corresponding monomers depicted, after appropriate derivatization of the diols as described in J. M. J. Frechet et al., *Polymer Journal*, 19(1), pp. 31-49 (1987):

TABLE 1

| | 2,4-TDI | MDI | Bisphenol A |
|---|---|---|---|
| HO-C(CH₃)₂-CH₂CH₂-C(CH₃)₂-OH | V | VI | III |
| HO-C(CH₃)₂-C≡C-C(CH₃)₂-OH | VII | VIII | IV |
| HO-C(CH₃)₂-C₆H₄-C(CH₃)₂-OH | IX | X | |
| HO-C(CH₃)₂-C(CH₃)₂-OH | XI | XII | |

The above polymers were evaluated by DSC. The results reported in Table 2 were obtained:

TABLE 2

| POLYMER | SOFTENING/MELT TEMP. (°C.) | MELT ENERGY (J/g) | DECOMPOSITION TEMP. (°C.) |
|---|---|---|---|
| III | 139 | 22 | 180 |
| IV | 50 | 21 | 170 |
| V | — | — | 200 |
| VI | — | — | 110 |
| VII | 46 | 85 | 165 |
| VIII | 100 | — | 113 |
| IX | — | — | 157 |
| X | 63 | — | 100 |
| XI | 94 | 22 | 206 |
| XII | 50 | 100 | 174 |
| Ethyl cellulose | 96 | 17 | 203 |
| Polyacetal | — | — | 171 |

EXAMPLE 2

The following solution was coated into ICI Melinex 516 polyester film, 12"×18" and 4 mils thick, with a #4 Meyer rod at a loading of 0.5 g wet weight/ft². Addition of the components was in the order indicated:

| 7.25 g | Acetone |
|---|---|
| 1.197 g | Copolymer of 2,4-TDI & 2,5-dimethyl-3-hexyne-2,5-diol (Polymer VII from Table 1) |
| 0.364 g | Cyasorb IR 165 |
| 0.12 g | 2,5-Dimethyl-3-hexyne-2,5-diol |
| 1.06 g | Morfast Yellow 101 |

The yellow film thus produced was imaged in registration with a newsprint receptor using a yellow halftone separation film master on a Crosfield Datrax 765 Facsimile system which employed a Nd:YAG laser with output wavelength 1064 nm and an adjustable power output of 3-14 Watts at the film plane. The Datrax 765 writer is commercial hardware available from Crosfield Electronics Ltd., Milton Keynes, UK. The imaging conditions for this experiment were adjusted to an output power of 10 Watts which gave a fluence of 0.16 J/cm², an intensity of $2 \times 10^6$ Watts/cm² and an addressability of 1,000 lpi at a $1/e^2$ spot diameter of 25 microns. The yellow film was maintained in direct contact with the newspaper receptor via vacuum hold down at a pressure of 20 inches Hg. An imaged yellow film (negative) and a registered yellow newsprint image (positive) were produced at a scan rate of 64 cm²/sec.

EXAMPLE 3

To make a two color print, the solution of Example 2 was prepared, but substituting a combination of Morfast Red 104, 0.76 g, and Morfast Violet 1001, 0.04 g, in place of the Morfast Yellow. The magenta film thus produced was imaged as described in Example 2 using magenta halftone separation data with the yellow print from Example 2 as the receptor sheet. A two color print (positive) and an imaged magenta film (negative) were produced.

EXAMPLE 4

To make a three color print, the solution of Example 2 was prepared, but substituting a combination of Morfast Blue 105, 0.4 g, and Morfast Blue 100, 0.4 g, in place of the Morfast Yellow. The cyan film thus produced was imaged as described in Example 2 using cyan halftone separation data with the two color print from Example 3 as the receptor sheet. A three color print (positive) and an image cyan film (negative) were produced.

EXAMPLE 5

To make a four color print, the solution of Example 2 was prepared, but substituting a combination of Morfast Brown 100, 0.36 g, Morfast Blue 105, 0.36 g, and Morfast Red, 0.36 g, in place of the Morfast Yellow. The neutral black film thus produced was imaged as described in Example 2 using black halftone separation data with the three color print from Example 4 as the receptor sheet. A four color print (positive) and an imaged black film (negative) were produced.

EXAMPLE 6

The following formulation was coated as described in Examples 2 through 5:

| | |
|---|---|
| 7.25 g | Acetone |
| 0.364 g | Cyasorb IR 165 |
| 2.5 g | American Ink & Coatings Co. gravure inks Process Yellow or Process Red or Process Blue or Process Black. |

The American Ink gravure inks included nitrocellulose. Films were imaged as described in Examples 2 through 5 to produce full color prints which meet ANPA specified solid ink hue and density on newsprint: cyan, 0.90–0.95, magenta, 0.90–0.95, yellow, 0.85–0.90, black, 1.00–1.05.

EXAMPLE 7

The following solution was formulated and coated as described in Examples 2 through 5:

| | |
|---|---|
| 7.25 g | Acetone |
| 1.197 g | Copolymer of 4,4'-diphenyl methane diisocyanate and PARADIOL (trademark of Goodyear Chemicals) (Polymer X from Table 1) |
| 0.364 g | Cyasorb IR 165 |
| 0.12 g | 2,5-Dimethyl-3-hexyne-2,5-diol |
| 2.5 g | American Ink & Coatings Co. gravure inks Process Yellow or Process Red or Process Blue or Process Black. |

Films were imaged as described in Examples 2 through 5 to produce full color prints, as well as individual imaged monocolor and black films.

EXAMPLE 8

To 8.35 g of a 50:50 mixture of 1,1,1-trichloroethane and methylene chloride were added 0.5 g of an alternating polycarbonate synthesized from Bisphenol A and 2,5-dimethylhexane-2,5-diol (Polymer III from Table 1); 0.1 g Cyasorb IR 165; 0.1 g 2,5-dimethyl-3-hexyne-2,5-diol; and 1.0 g of any one of the Morfast colors described above. The solutions were coated at a loading of 1 g of solution/sq.ft. with a #9 Meyer rod by hand drawdown. The dried films were imaged at 0.11 J/cm² versus the 0.16 J/cm² in Example 2 on a Crosfield Datrax 765 to produce a color print on a receptor sheet and imaged monocolor or black films.

EXAMPLE 9

To 9.35 g of a 50:50 mixture of 1,1,1-trichloroethane and methylene chloride were added 0.5 g of an alternating polycarbonate prepared from Bisphenol A and 2,5-dimethyl-3-hexyne-2,5-diol (Polymer IV from Table 1); 0.1 g Cyasorb IR 165; and 0.05 g of 2,5-dimethyl-3-hexyne-2,5-diol. The solution was coated on polyester film and imaged at 0.08 J/cm² versus the 0.11 J/cm² in Example 8 as described above to produce an imaged light tan film and a reversal light tan image on a newsprint receptor sheet.

By comparison, films prepared from bisphenol A polycarbonates, polyvinylidene chloride (Saran F120 or F300), polymethacrylonitrile, ethylcellulose N-7, or styrene/acrylonitrile copolymer as binders in place of an ablative polycarbonate or polyurethane provided very little or no image transfer to the receptor sheet at the imaging fluence employed in this example.

While this invention has been described in terms of various preferred embodiments, the skilled artisan will appreciate that various modifications, substitutions, omissions and changes may be made without departing from the spirit thereof. Accordingly, it is intended that the scope of the present invention be limited solely by the scope of the following claims including equivalents thereof.

What is claimed is:

1. A method for transferring a contrasting pattern of intelligence from an ablation-transfer imaging medium to a receptor element in contiguous registration therewith, said ablation-transfer imaging medium comprising a support substrate and an imaging radiation-ablative topcoat essentially coextensive therewith, said essentially coextensive topcoat comprising an effective ablative-transfer effecting amount of a non-black body, non-imaging sensitizer that absorbs such imaging radiation at a rate sufficient to effect the imagewise ablation mass transfer of said topcoat, and said imaging radiation-ablative topcoat including an imaging amount of a non-black body, non-ablation sensitizing contrast imaging material contained therein, which method comprises imagewise irradiating said ablation-transfer imaging medium according to such pattern of intelligence with an intensity sufficient to effect the ablation mass transfer of the volume of the imagewise-exposed area of the radiation-ablative topcoat of said imaging medium securedly onto said receptor element, including mass transfer onto said receptor element of the non-ablation sensitizing contrast imaging material contained therein, and whereby said transferred contrast imaging material delineates said pattern of intelligence thereon.

2. A method for transferring a contrasting pattern of intelligence from an ablation-transfer imaging medium to a receptor element in contiguous registration therewith, said ablation-transfer imaging medium comprising a support substrate and a photoradiation-ablative topcoat essentially coextensive therewith, said extensively coextensive topcoat comprising an effective ablative-transfer effecting amount of a non-black body, non-imaging sensitizer that absorbs such imaging radiation at a rate sufficient to effect the imagewise ablation mass transfer of said topcoat, and said photoradiation-ablative topcoat including an imaging amount of a non-black body, non-ablation sensitizing contrast imaging material contained therein, which method comprises imagewise photoirradiating said ablation-transfer imaging medium according to such pattern of intelligence with an intensity sufficient to effect the ablation mass transfer of the volume of the imagewise-exposed area of the radiation-ablative topcoat of said imaging medium securedly onto said receptor element, including mass transfer onto said receptor element of the non-ablation sensitizing contrast imaging material contained therein, and whereby said transferred contrast imaging material delineates said pattern of intelligence thereon.

3. A method for transferring a contrasting pattern of intelligence from an ablation-transfer imaging medium to a receptor element in contiguous registration therewith, said ablation-transfer imaging medium comprising a support substrate and a laser radiation-ablative topcoat essentially coextensive therewith, said extensively coextensive topcoat comprising an effective ablative-transfer effecting amount of a non-black body, non-imaging sensitizer that absorbs such imaging radiation at a rate sufficient to effect the imagewise ablation mass transfer of said topcoat, and said laser radiation-ablative topcoat including an imaging amount of a non-black body, non-ablation sensitizing contrast imaging material contained therein, which method comprises imagewise photoirradiating said ablation-transfer imaging medium according to such pattern of intelligence with an intensity sufficient to effect the ablation mass transfer of the volume of the imagewise-exposed area of the laser radiation-ablative topcoat of said imaging medium securedly onto said receptor element, including mass transfer onto said receptor element of the non-ablation sensitizing contrast imaging material contained therein, and whereby said transferred contrast imaging material delineates said pattern of intelligence thereon.

4. The method as defined by claim 3, said essentially coextensive topcoat of said imaging medium comprising at least one laser-ablative binder.

5. The method as defined by claim 4, said essentially coextensive topcoat of said imaging medium comprising at least one laser absorber/sensitizer.

6. The method as defined by claim 5, said at least one absorber/sensitizer comprising a cyanine or phthalocyanine dye, a metal dithiolene, a methylene blue salt, a di- or triarylmethane cation salt, a Wurster's blue salt or an onium salt.

7. The method as defined by claim 5, said at least one laser absorber/sensitizer initiating acid formation upon photo-excitation thereof.

8. The method as defined by claim 5, said at least one laser absorber/sensitizer being substantially colorless in the visible spectral region.

9. The method as defined by claim 5, said at least one laser-ablative binder comprising from about 20% to 95% by weight of said essentially coextensive topcoat.

10. The method as defined by claim 5, said support substrate of said imaging medium comprising glass, a polyester, a polycarbonate, a polyurethane, a polyolefin, a polyamide, a polysulfone, a polystyrene, or a cellulosic.

11. The method as defined by claim 5, said support substrate of said imaging medium comprising a filled and/or coated opaque polyester, aluminum or silicon.

12. The method as defined by claim 5, comprising imagewise laser-irradiating said ablation-transfer imaging medium by means of a Nd:YAG laser.

13. The method as defined by claim 5, comprising imagewise laser-irradiating said ablation-transfer imaging medium by means of a laser diode or an array thereof.

14. The method as defined by claim 5, comprising imagewise laser-irradiating said ablation-transfer imaging medium at a power density of at least $10^4$ watts/cm$^2$.

15. The method as defined by claim 5, said imaging medium being biased in face-to-face registered direct contact with said receptor element.

16. The method as defined by claim 15, said receptor element comprising a newsprint, paper, plastic, film, metal or fabric.

17. The method as defined by claim 3, comprising transferring a masking pattern of intelligence to said receptor element.

18. The method as defined by claim 3, comprising transferring a color proof to said receptor element.

19. The method as defined by claim 18, said receptor element comprising paper.

20. The method as defined by claim 18, said receptor element comprising a plastic sheet.

21. The method as defined by claim 18, carried out successively employing a common receptor element but a plurality of ablation-transfer imaging media, the respective ablative topcoats of which including different contrast imaging colorants, and comprising transferring a multi-color proof to said common receptor element.

22. The method as defined by claim 3, comprising transferring the magnetic pattern of intelligence to said receptor element.

23. The method as defined by claim 3, comprising transferring the fluorescent pattern of intelligence to said receptor element.

24. The method as defined by claim 3, comprising transferring an electrically conducting pattern of intelligence to said receptor element.

25. The method as defined by claim 5, said at least one laser absorber/sensitizer comprising at least one near infrared absorber/sensitizer.

26. The method as defined by claim 25, said support substrate of said imaging medium being transparent to near infrared laser irradiation.

27. The method as defined by claim 25, said support substrate of said imaging medium being opaque to near infrared laser irradiation.

28. The method as defined by claim 25, said at least one near infrared absorber/sensitizer comprising an aromatic amine radical cation.

29. The method as defined by claim 25, said at least one near infrared absorber/sensitizer comprising a cation radial and an anion of a strong acid.

30. The method as defined by claim 25, said at least one near infrared absorber/sensitizer being soluble in said at least one laser-ablative binder.

31. The method as defined by claim 25, said essentially coextensive topcoat comprising an ablation-enhancing amount of at least one laser-ablative binder decomposable by acid catalysis.

32. The method as define by claim 31, said at least one laser-ablative binder being adopted for acid catalyzed decomposition at a temperature of less than about 200° C. as measured under equilibrium conditions.

33. The method as defined by claim 32, said at least one laser-ablative binder comprising a nitrocellulose, polycarbonate, polyurethane, polyester, polyorthoester or polyacetal.

34. The method as defined by claim 31, said at least one laser-ablative binder being adopted for acid catalyzed decomposition at a temperature of less than about 100° C. as measured under equilibrium conditions.

35. The method as defined by claim 31, said essentially coextensive topcoat further comprising an ablation-enhancing amount of at least one hydrogen atom donor that promotes acid formation effecting the acid catalyzed decomposition of said at least one binder.

36. The method as defined by claim 35, said at least one hydrogen atom donor comprising an alcohol, thiol, phenol, amine or hydrocarbon.

37. The method as defined by claim 33, said at least one laser-ablative binder comprising a nitrocellulose.

38. The method as defined by claim 33, said at least one laser-ablative binder comprising a polycarbonate.

39. The method as defined by claim 38, said polycarbonate comprising recurring structural units of the formula:

wherein B is a divalent radical generating a tertiary carbonium ion upon thermolysis thereof and A may be identical to B or is the divalent residue of a polycarbonate-forming aromatic dihydroxy or polyhydroxy compound.

40. The method as defined by claim 39, wherein said formula B is one of the following divalent radicals:

41. The method as defined by claim 33, said at least one laser-ablative binder comprising a polyurethane.

42. The method as defined by claim 41, said polyurethane comprising recurring structural units of the formula:

wherein B is a divalent radical generating a tertiary carbonium ion upon thermolysis thereof and A is a divalent residue of a polyurethane-forming diisocyanate or polyisocyanate.

43. The method as defined by claim 42, wherein said formula B is one of the following divalent radicals:

44. The method as defined by claim 33, said at least one laser-ablative binder comprising a polyester.

45. The method as defined by claim 3, said non-black body, non-ablation sensitizing contrast imaging material comprising a colorant, an ultraviolet or infrared absorbing material, a magnetic material a polymeric material, a fluorescent material, a conducting material, or mixture thereof.

46. The method as defined by claim 45, said non-black body, non-ablation sensitizing contrast imaging material comprising a yellow, magenta or cyan dye or pigment.

47. The method as defined by claim 45, said non-black body, non-ablation sensitizing contrast imaging material comprising a fluorescent oxazole, oxadizole, courmarin or carbostyryl derivative.

48. The method as defined by claim 45, said non-black body, non-ablation sensitizing contrast imaging material comprising magnetic particles.

49. The method as defined by claim 48, said at least one laser absorber/sensitizer comprising from about 5% to 50% by weight of said essentially coextensive topcoat.

50. The method as defined by claim 3, said non-black body, non-ablation sensitizing contrast imaging material being highly absorbing in the spectral region of 350 nm to 450 nm.

51. The method as defined by claim 50, said non-black body, non-ablation sensitizing contrast imaging material comprising curcumin, an azo derivative, an oxadiazole derivative, a dicinnamalacetone derivative or a benzophenone derivative.

* * * * *

UNITED STATES PATENT AND TRADEMARK OFFICE
CERTIFICATE OF CORRECTION

PATENT NO. : 5,156,938
DATED : October 20, 1992
INVENTOR(S) : Foley et al.

It is certified that error appears in the above-identified patent and that said Letters Patent is hereby corrected as shown below:

At Column 1,   line 24, amend "contract" to --contrast--;
               line 25, amend "container" to --contained--; and
               line 37, amend "particular" to --particularly--.

At Column 2,   line 49, amend "that" to --than--.

At Column 3,   line 6, amend "These" to --There--; and
               line 68, amend "data" to --date--.

At Column 4,   line 23, amend "container" to --contained--; and
               line 27, amend "intelligent" to --intelligence--.

At Column 13,  line 20, amend "dios" to --diols--.

At Column 14,  line 24, amend "courmarin" to --coumarin--.

At Column 15,  line 31, amend "As" to --An--.

At Column 18,  line 10, amend "into" to --onto--.

In Claim 2, at Column 21, line 11, amend "extensively" to --essentially--.

UNITED STATES PATENT AND TRADEMARK OFFICE
CERTIFICATE OF CORRECTION

PATENT NO. : 5,156,938

DATED : October 20, 1992

INVENTOR(S) : Foley et al.

It is certified that error appears in the above-identified patent and that said Letters Patent is hereby corrected as shown below:

In Claim 3, at Column 21, line 36, amend "extensively" to
--essentially--; and
line 45, amend " photoirradiating" to
--laser-irradiating--.

In Claim 45, at Column 24, line 63, after "magnetic material" insert --,--.

In Claim 47, at Column 25, line 4, amend "courmarin" to
--coumarin--.

Signed and Sealed this

Second Day of November, 1993

Attest:

BRUCE LEHMAN

Attesting Officer    Commissioner of Patents and Trademarks